United States Patent
Munsell et al.

[11] Patent Number: 5,982,179
[45] Date of Patent: Nov. 9, 1999

[54] NMR CIRCUIT-SWITCH

[75] Inventors: Andrew W. Munsell, Tucson, Ariz.;
Robert G. Rice, Mountain Veiw;
James P. Finnigan, Santa Clara, both of Calif.

[73] Assignee: Varian, Inc., Palo Alto, Calif.

[21] Appl. No.: 08/869,268

[22] Filed: Jun. 4, 1997

[51] Int. Cl.⁶ ....................................................... G01V 3/00
[52] U.S. Cl. ............................................. 324/322; 370/281
[58] Field of Search .......................... 324/322; 200/2–54; 370/281, 339

[56] References Cited

U.S. PATENT DOCUMENTS

| | | | |
|---|---|---|---|
| 3,624,508 | 11/1971 | Kach | 370/281 |
| 3,713,092 | 1/1973 | Ivenbaum | 340/58 |
| 4,074,787 | 2/1978 | Cunningham et al. | 180/82 |

*Primary Examiner*—Louis Arana
*Attorney, Agent, or Firm*—Edward H. Berkowitz

[57] ABSTRACT

A ¼ wave circuit switch for use in an NMR probe has a housing with a stepped cavity for precisely locating switch components inside. The ¼ wave circuit switch cooperates with a ¼ wave tube and is designed to receive either an external capacitor on a capacitor stick for single tune operations or a ¼ wave center conductor with a threaded tip on a ¼ wave stick for double tune operations. For single tune operations, the external capacitor comes into contact at one end with a resiliently supported, movable electrical contact and at the other end with a spring clip inside the housing cavity to orient the external capacitor in parallel with the NMR coil. The movable electrical contact is resiliently biased by a pair of crescent washers supported by an insert plug which serves as a positive stop for the travel of the electrical contact. For double tune operations, the threaded tip of the ¼ wave center conductor simultaneously contacts a pair of threaded contacts provided inside the housing cavity and spaced by an insulating spacer. The simultaneous contact creates a current path which grounds the NMR circuit through the ¼ wave tube, so that the NMR circuit may resonate at two separate frequencies. The two frequencies can be easily adjusted by employing an extension tube that effectively changes the length of the ¼ wave tube and grounds the NMR circuit through the ¼ wave tube to resonate at different frequencies.

30 Claims, 10 Drawing Sheets

NMR CIRCUIT-SWITCH

FIELD OF THE INVENTION

This invention relates generally to a circuit switch in a nuclear magnetic resonance (NMR) probe, and more particularly to an NMR ¼ wave circuit switch that locates switch components precisely and effectively to provide single-tune and double-tune modes in a single NMR probe.

BACKGROUND OF THE INVENTION

An NMR probe holds a sample placed in a uniform polarizing magnetic field in NMR spectrometry. A coil is disposed close to the sample within the probe to apply an exciting RF magnetic field to the sample. The resultant resonance signal of the sample is picked up by the coil and delivered to a receiver circuit. The receiver circuit generates an output signal. A computer takes the Fourier transform of the signal to obtain an NMR spectrum.

The NMR apparatus is most often characterized in gross by cylindrical symmetry. The internal structure of the probe generally exhibits no geometric symmetry because it contains circuits, circuit elements, connectors, fluid supply tubes, and mechanical mounting means for all of the above and the like. A typical NMR magnet is of the superconducting variety and is housed in a dewar which includes a room temperature cylindrical bore in which a very carefully controlled homogeneous magnetic field is sustained by operation of the superconducting magnet in the interior of the dewar. The NMR probe contains the excitation and detection interface to the sample and is mounted in a cylindrical housing for insertion in the bore.

It is often desirable to use an NMR probe to resonate at frequencies outside of the standard range of frequencies of the probe. In addition, NMR probes are used in single tune mode and double tune mode. Because existing NMR probes are generally constructed for use only in either single tune operation or double tune operation, two NMR probes are needed for applications in single tune and double tune.

SUMMARY OF THE INVENTION

There is therefore a need for a single probe design that effectively facilitates single tune and double tune operations with an enlarged resonant frequency range.

It is a feature of the present invention to provide a ¼ wave circuit switch that is disposed in an NMR probe and adapted to receive a variety of external capacitors for single tune operations and to cooperate with a ¼ wave tube and center conductor to produce double tune operations with ease and efficiency.

It is another feature of this invention to effectively secure the external capacitor with the ¼ wave circuit switch when installed for single tune operation.

In accordance with an aspect of the present invention, an NMR circuit switch for use in an NMR probe comprises a housing having a proximal end and a distal end which define a cavity therebetween. A stopper is disposed inside the cavity near the proximal end of the cavity. At least one resilient washer is disposed inside the cavity adjacent the stopper. An electrically conducting piston is slidably disposed inside the cavity adjacent the resilient washer. The piston is constrained by the stopper and resilient washer in a proximal direction toward the proximal end and by a constraint provided in the cavity in a distal direction toward the distal end.

In accordance with another aspect of this invention, a ¼ wave circuit switch for NMR spectrometry comprises a housing having a wall with a proximal end defining a proximal direction and a distal end defining a distal direction. The housing has a cavity defined by the wall and extending from the proximal end to the distal end. The cavity includes a plurality of cavity steps with distal constraints. An insert plug is disposed in a first such cavity step adjacent the proximal end and bears against a first such distal constraint. A piston is disposed in a second such cavity step distal of the first cavity step and bears against a second such distal constraint. The piston is slidable relative to the second distal constraint. A pair of spring washers are disposed between and in contact with the piston and the insert plug. A pair of threaded contacts are spaced by an insulator. The threaded contacts and insulator are disposed in a third such cavity step distal of the second cavity step and bears against a third such distal constraint. The threaded contacts are spaced from the piston. A spring clip is disposed in the third cavity step and spaced between the piston and the threaded contacts.

Another aspect of the invention is a ¼ wave circuit switch for use with a ¼ wave tube in single tune and double tune operations. The ¼ wave circuit switch comprises a housing having a wall defining a cavity. A pair of electrically conducting threaded contacts are insulated from each other and supported inside the cavity. A resiliently supported, movable electrical contact is disposed inside the cavity and spaced from the threaded contacts. An electrically conducting spring clip extends from the wall of the housing into a space in the cavity between the threaded contacts and the movable electrical contact.

In accordance with another aspect of this invention is an NMR circuit switch which comprises a housing including a cavity extending from a proximal end to a distal end for detachably receiving a capacitor stick holding an external capacitor. A first threaded member is supported inside the cavity and mates with a threaded portion of the capacitor stick to form a threaded mount. A first contact means is disposed inside the cavity for electrically contacting a first end of the external capacitor and resiliently compressing the capacitor stick against the threaded mount to prevent unthreading between the first threaded member and the threaded portion. A second contact means is supported inside the cavity for electrically contacting a second end of the external capacity.

Yet another aspect of the present invention is a ¼ wave circuit assembly which comprises a circuit switch having a cavity defined between a proximal end and a distal end. The circuit switch includes a pair of electrical contacts spaced by an insulating spacer and disposed in the cavity. A ¼ wave tube has a proximal end connected to the distal end of the housing. A ¼ wave stick detachably extends through the ¼ wave tube and at least partially through the cavity. The ¼ wave stick comprises a ¼ wave center conductor having a tip near a proximal end for electrically contacting the pair of electrical contacts and a shorting member near a distal end for electrical communication of the ¼ wave center conductor with the ¼ wave tube.

BRIEF DESCRIPTION OF THE DRAWINGS

The preferred embodiments of this invention, illustrating all their features, will now be discussed in detail. These embodiments depict the novel and nonobvious NMR circuit switch of this invention shown in the accompanying drawings, which are included for illustrative purposes only. These drawings include the following figures, with like numerals indicating like parts.

DETAILED DESCRIPTION OF THE INVENTION

Figure 1:
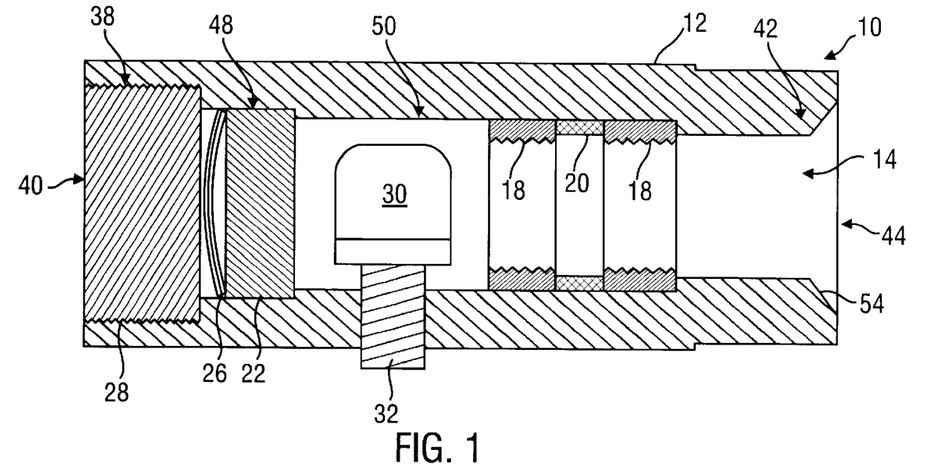
FIG. 1 is a partial cross-sectional view illustrating a ¼ wave circuit switch of the present invention.

The ¼ wave circuit switch 10 shown in FIG. 1 of the present invention is first described in detail. The ¼ wave circuit switch assembly 10 when installed in an NMR probe (not shown) advantageously permits the NMR probe to switch between single tune and double tune modes of operation. The use of the ¼ wave circuit switch 10 for single tune and double tune operations is then discussed.

A. ¼ Wave Circuit Switch Assembly

Figure 2:
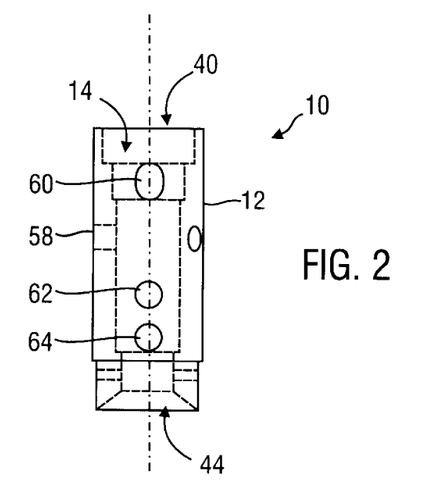
FIG. 2 is a front elevational view of the housing of the ¼ wave circuit switch of FIG. 1.
Figure 3:
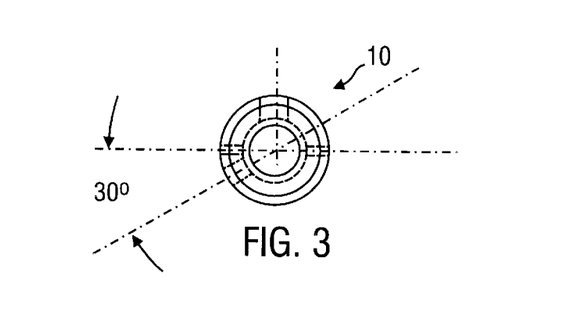
FIG. 3 is a bottom plan view of the housing of FIG. 2.
Figure 4:
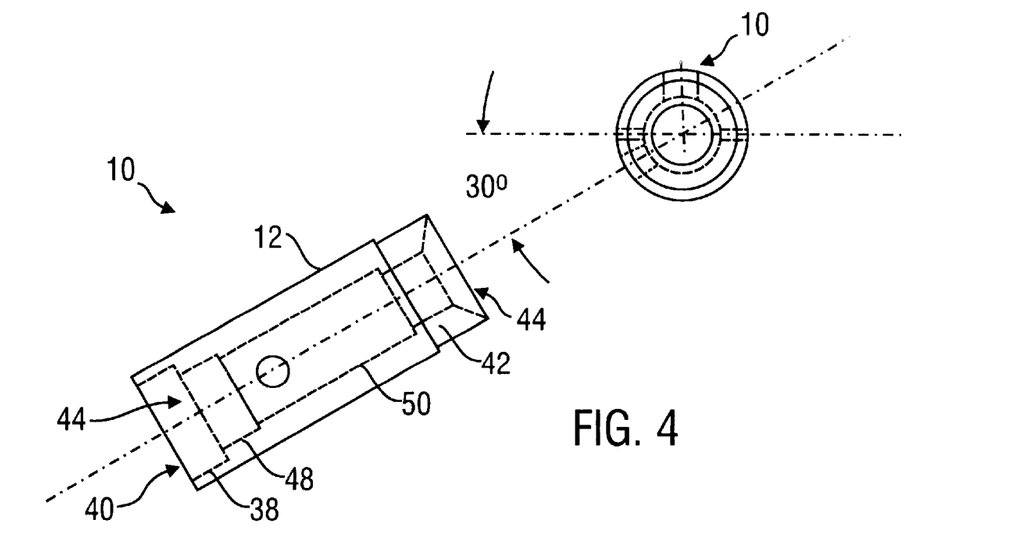
FIG. 4 is an oblique side view of the housing of FIG. 2.

Referring to FIG. 1, the ¼ wave circuit switch assembly 10 of the present invention comprises a housing 12 with a cavity 14 that houses a pair of threaded contacts 18 spaced from each other by a spacer 20, a piston 22, a pair of resilient washers 26, an insert plug 28, and a spring clip 30 connected to a stud 32. FIGS. 2–4 show the housing 12 and the cavity 14 that are generally symmetrical about its axis with the housing 12 having a generally circular cylindrical exterior. The housing 12 is advantageously machined with steps in the cavity 14 to precisely and conveniently locate these individual components. FIGS. 1–4 show four cavity steps in the housing cavity 14 of decreasing cross-sectional size, with the largest first cavity step 38 open to a first end or proximal end 40 of the housing 12 and the smallest fourth cavity step 42 open to a second end or distal end 44 of the housing 12. The second cavity step 48 is adjacent to and distal of the first cavity step 38 and the third cavity step 50 is disposed between the second cavity step 48 and fourth cavity step 42. The fourth cavity step 42 includes a countersunk opening 54, which conveniently facilitates insertion of objects through the distal end 44.

The housing 12 includes a plurality of apertures through the wall to facilitate insertion of various objects and wiring connections. For instance, the stud slot 58 is provided for inserting and attaching the stud 32 which is used to mount the spring clip 30. The first aperture 60 allows the piston 22 to be electrically connected through wiring to the NMR circuit (see FIG. 11), and the second and third apertures 62, 64 allow the threaded contacts 18 to be electrically connected through wiring to the NMR circuit (see FIG. 11). The housing 12 is advantageously made of an insulating, electrically nonconducting material, such as Teflon.

Referring to FIG. 1, the insert plug 28 is desirably screwed into and disposed inside the first cavity step 38, which serves as a first distal constraint to precisely locate the insert plug 28. The piston 22 and resilient washers 26 are disposed in the second cavity step 48 adjacent the first cavity step 38 advantageously by slip-fit, with the resilient washers 26 staked in series and sandwiched between the insert plug 28 and the piston 22. The piston 22 is constrained by the second distal constraint of the second cavity step 48 which limits its movement in the distal direction toward the distal end 44. The insert plug 28 and resilient washers 26 define a resilient proximal constraint that limit the movement of the piston 22 in the proximal direction toward the proximal end 40, with the insert plug 28 serving as a positive stop for the travel of the piston 22. The piston 22 is thus a resiliently supported, movable member that is resiliently biased by the resilient washers 26 toward the pair of threaded contacts 18 disposed near the distal end 44 of the housing 12. In the third cavity step 50 adjacent the second cavity step 48, the threaded contacts 18 are desirably press fitted with the spacer 20 sandwiched therebetween, and are precisely located by the third distal constraint provided by the third cavity step 50. The threaded contacts 18 are spaced from the piston 22 by a space in which the spring clip 30 is advantageously disposed using a mounting screw (not shown) through the stud 32 connected through the stud slot 58 of the wall of the housing 12. As assembled, the insert plug 28, resilient washers 26, piston 22, threaded contacts 18, and spacer 20 advantageously are generally symmetrical with respect to the axis of the housing 12.

Figure 5:
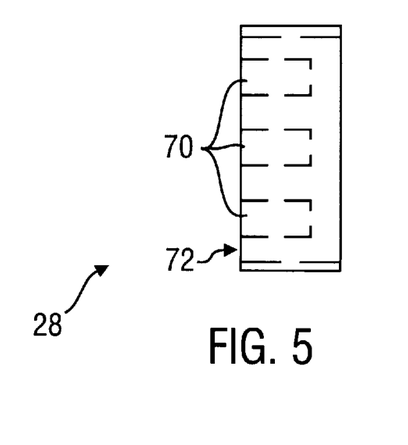
FIG. 5 is a side elevational view of the insert plug in the ¼ wave circuit switch of FIG. 1.
Figure 6:
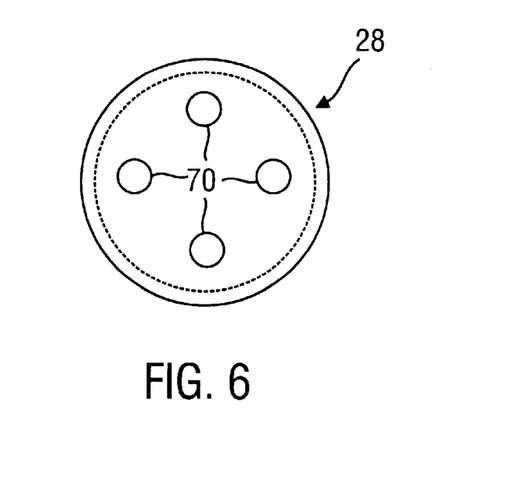
FIG. 6 is a front elevational view of the insert plug of FIG. 5.

The insert plug 28 is a generally circular disk with a threaded external wall, as seen in FIGS. 5 and 6. A plurality of part-through holes or slots 70, desirably four such slots 70, are advantageously provided on the exterior surface 72 facing outwardly of the first end 40 of the housing 12 to facilitate inserting the insert plug 28 into the first cavity step 38 of the housing 12. The exterior surface of the insert plug 28 is desirably flush with the switch housing 12 at the first end 40 when installed. The insert plug 28 is made of an insulating, electrically nonconducting material, desirably Teflon.

Figure 7:
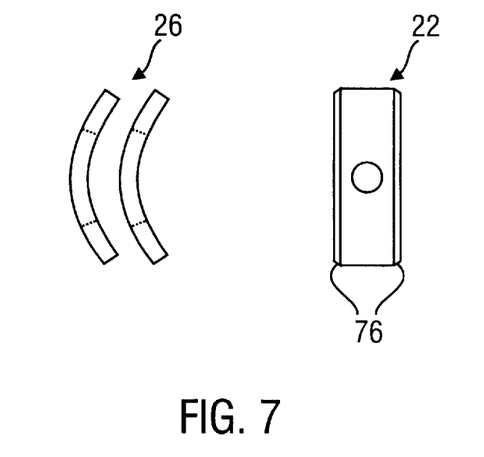
FIG. 7 is an exploded front elevational view of the piston and crescent washers in the ¼ wave circuit switch of FIG. 1.

FIG. 7 shows the piston 22 as a generally circular disk with tapered or chamfered edges 76 that facilitate sliding of the piston 22 back and forth inside the second cavity step 48 of the housing 12. The height of the piston 22 is advantageously chosen to leave a spacing in the second cavity step 48 to precisely locate the pair of resilient washers 26 and sandwich them between the insert plug 28 and the piston 22. The resilient washers 26 are desirably spring washers, more desirably crescent washers, that can store compressive energy upon compression to reform and return the piston 22 to its original position upon release of the compression. The number of crescent washers 26 is at least one, and more desirably two to store sufficient compressive energy. The number and size of crescent washers 26 to be used can be determined without undue experimentation for a given circuit switch 10. The piston 22 and crescent washers 26 are made of electrically conducting materials, desirably metals, such as copper and beryllium copper.

Figure 8:
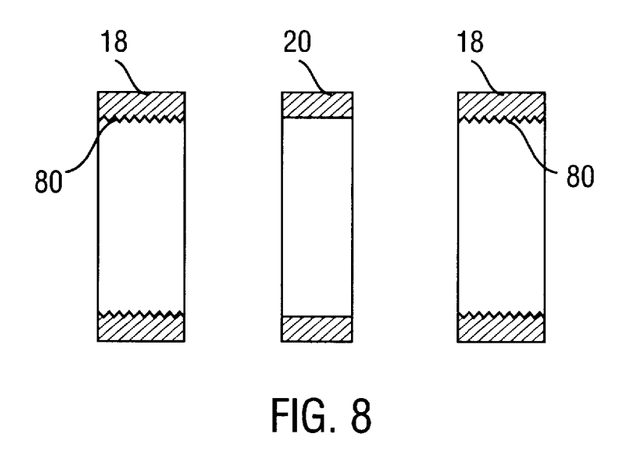
FIG. 8 is a cross-sectional view of the threaded contacts with the spacer in the ¼ wave circuit switch of FIG. 1.

The pair of threaded contacts 18 and spacer 20 are generally annular rings or disks, advantageously with generally the same wall thickness and straight knurled external wall surfaces to keep them from rotating in the housing 12, as best seen in FIG. 8. The thickness is desirably chosen so that the interior hollow cross-sectional area of the threaded contacts 18 and spacer 20 is approximately the same as or slightly smaller than that found in the fourth cavity step 42. The threaded contacts 18 have threaded interior wall surfaces 80. The outer diameters of the threaded contacts 18 and spacer 20 are desirably large enough to create an interference with the interior wall of the third cavity step 50 of the housing cavity 14 to allow them to be press fitted into the third cavity step 50. The threaded contacts 18 are made of an electrically conducting material, desirably a metal, such as OFHC copper. The spacer 20 is made of an insulating, electrically nonconducting material, desirably Teflon, and serves as an insulator for the threaded contacts 18.

Figure 9:
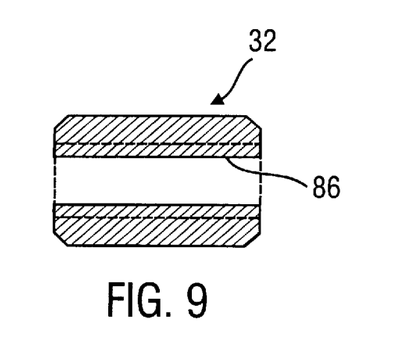
FIG. 9 is a cross-sectional view of the stud in the ¼ wave circuit switch of FIG. 1.
Figure 10:
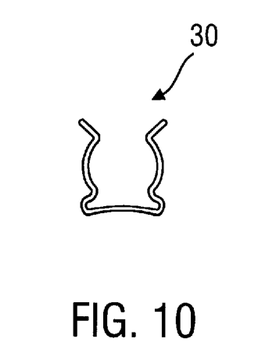
FIG. 10 is an elevational view of the spring clip in the ¼ wave circuit switch of FIG. 1.

FIG. 9 illustrates the stud 32 used for mounting the spring clip 30 shown in FIG. 10 with the mounting screw (not shown), which attaches the spring clip 30 and extends it into the third cavity step 50 from the stud 32. The stud 32 is sized to fit through the stud slot 58 of the wall of the housing 12, and has a threaded interior channel 86 through which the mounting screw extends to engage the spring clip 30, e.g., by welding or soldering. FIG. 10 shows a C-clip as an example of a spring clip 30, but it is understood that other suitable types of clips known in the art can be used. The C-clip 30 is advantageously oriented with the open area facing in parallel with the cavity opening at the distal end 44 of the housing. The spring clip 30, stud 32, and mounting screw are made of electrically conducting materials, such as metals. The spring clip 30 is desirably made of beryllium copper, while the stud 32 is desirably made of OFHC copper and the mounting screw of brass.

To assemble the ¼ wave circuit switch 10 shown in FIG. 1, an inserting tool such as a threaded bolt (not shown) is used to press fit the threaded contacts 18 with the spacer 20 disposed therebetween through the proximal end 40 into the third cavity step 50 of the switch housing 12 against the third distal constraint provided therein. The spring clip 30 is inserted into the third cavity step 50 and connected to the stud 32 with the mounting screw (not shown). The piston 22 and the crescent washers 26 are slip fitted into the second cavity step 48 against the second distal constraint, with the crescent washers 26 facing the first cavity step 38. The crescent washers 26 may be oriented opposite from those shown. The four surface slots 70 located at the top 72 of the threaded insert plug 28 are gripped by a pair of tweezers (not shown) to screw the insert plug 28 through the first end 40 into the first cavity step 38 against the first distal constraint. Electrical connections to the components inside the cavity 14 are made through the apertures (60, 62, 64, etc.) provided through the wall of the housing 12 (see FIG. 11). The stepped cavity 14 facilitates quick and precise assembly of the components of the circuit switch 10. Moreover, the design of the circuit switch 10 allows a single NMR probe to be used for both single tune and double tune modes of operation as discussed below.

B. Single Tune Configuration

Figure 11:
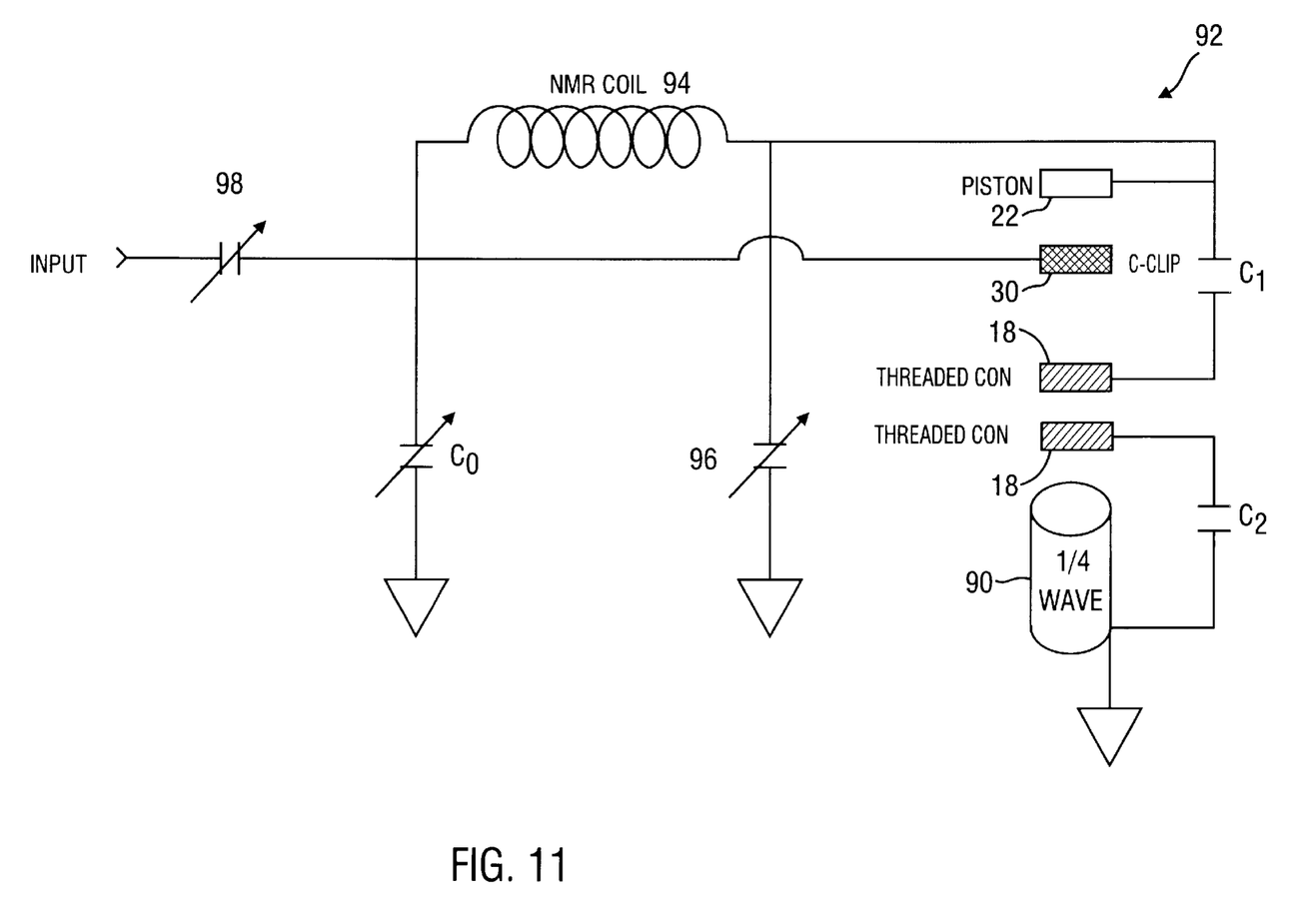
FIG. 11 is a schematic diagram illustrating the NMR circuit with the ¼ wave circuit switch of FIG. 1.
Figure 12:
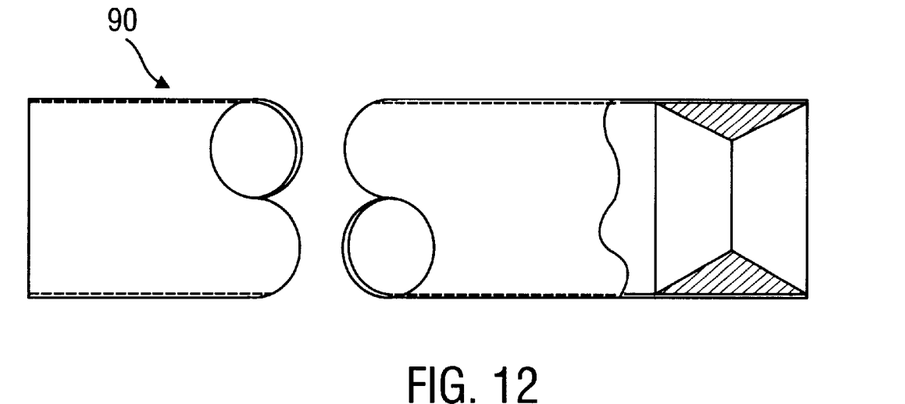
FIG. 12 is a side partial cross-sectional view of a ¼ wave tube.
Figure 13:
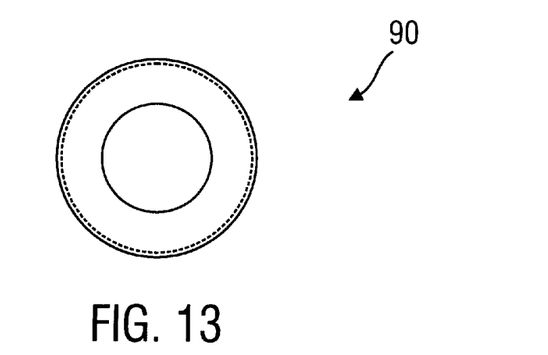
FIG. 13 is a front elevational view of the ¼ wave tube of FIG. 12.

The ¼ wave circuit switch 10 may be adapted to a ¼ wave tube 90 schematically shown in FIG. 11 to produce a single-tune probe for an NMR circuit or LC circuit 92 with an NMR coil 94. A ¼ wave tube 90, desirably made of OFHC copper, is illustrated in FIGS. 12 and 13. Other ¼ wave tubes known in the art may be used, and the details of the ¼ wave tube 90 are known in the art and thus not discussed. Referring to the NMR circuit 92 of FIG. 11, the piston 22 inside the switch housing 12 is connected to a first tune variable capacitor 96 and the spring clip 30 is connected to a second tune variable capacitor 98, desirably via a silver wiring. The NMR circuit 92 shown further includes another variable capacitor $C_0$ and two other capacitors $C_1$ and $C_2$, but it is noted that other NMR circuits known in the art may also be employed.

Figure 14:
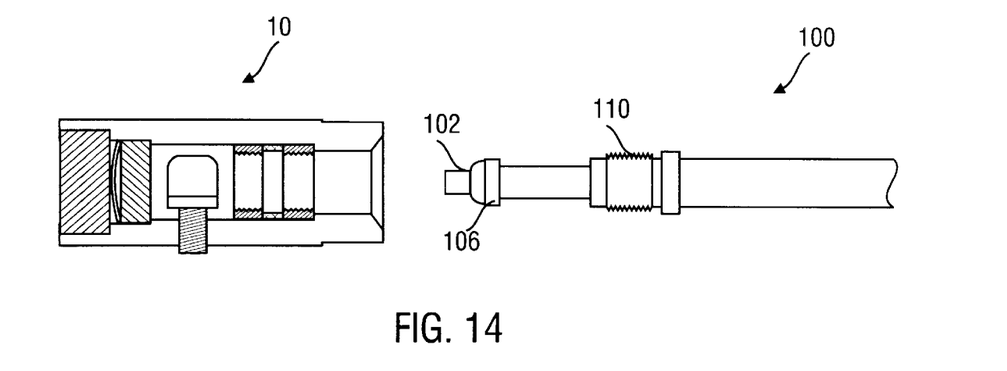
FIG. 14 is a front elevational view of a capacitor stick adjacent the ¼ wave circuit switch of FIG. 1.

For single tune operations, a capacitor stick 100 is desirably provided with an external capacitor 102 that is advantageously variable and connected at one end of the capacitor stick 100 as shown in FIG. 14. The external capacitor 102 shown is a chip capacitor, although other suitable types of capacitors may also be used. The chip capacitor 102 is advantageously supported by a capacitor stick standoff 106. An exterior threaded mount 110 is desirably provided at the capacitor stick 100 and spaced from the chip capacitor 102 by a distance preferably approximately equal to the distance separating the piston 22 from the interior threaded wall of the fourth cavity step 42 of the switch housing 12.

Figure 15:
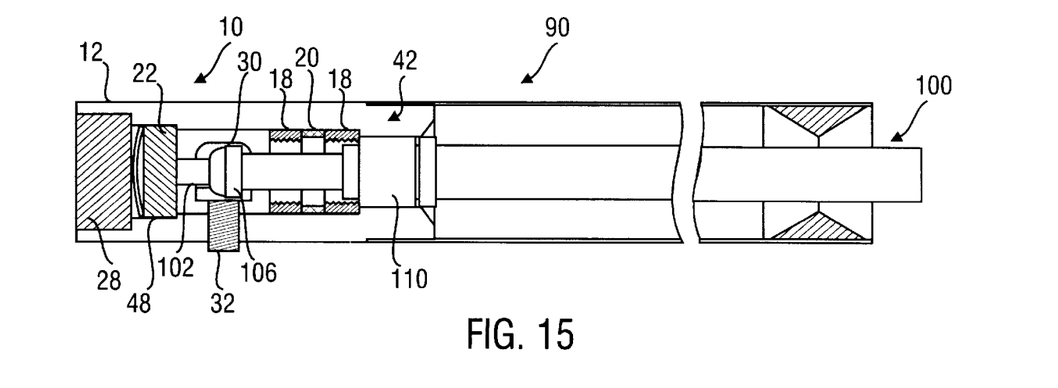
FIG. 15 is a partial cross-sectional view illustrating the assembly of the capacitor stick inserted into the ¼ wave circuit switch of FIG. 14 for single-tune operation.

The chip capacitor 102 of the capacitor stick 100 is desirably inserted into the switch housing 12 to connect at one electrically conducting end to the piston 22 and at the other electrically conducting end to the spring clip 30, which is oriented and sized to facilitate such insertion and to clip onto the capacitor stick standoff 106 of the capacitor stick 100, as best seen in the assembled illustration of FIG. 15. The connection of the external capacitor 102 in this manner orients the external capacitor 102 in parallel with the NMR coil 94, as best seen in the single tune NMR circuit 114 of FIG. 16. With the presence of the external capacitor 102, the LC circuit 114 can be tuned to a variety of different frequencies by changing the external capacitor 102 and thus the frequency range. In addition, FIG. 15 shows a slip fit or press fit between a portion of the distal end 44 of the switch housing 12 and the proximal end of the ¼ wave tube 90 to form a generally continuous external surface, but other suitable methods can be used for connecting the ¼ wave circuit switch 10 and the ¼ wave tube 90.

Figure 16:
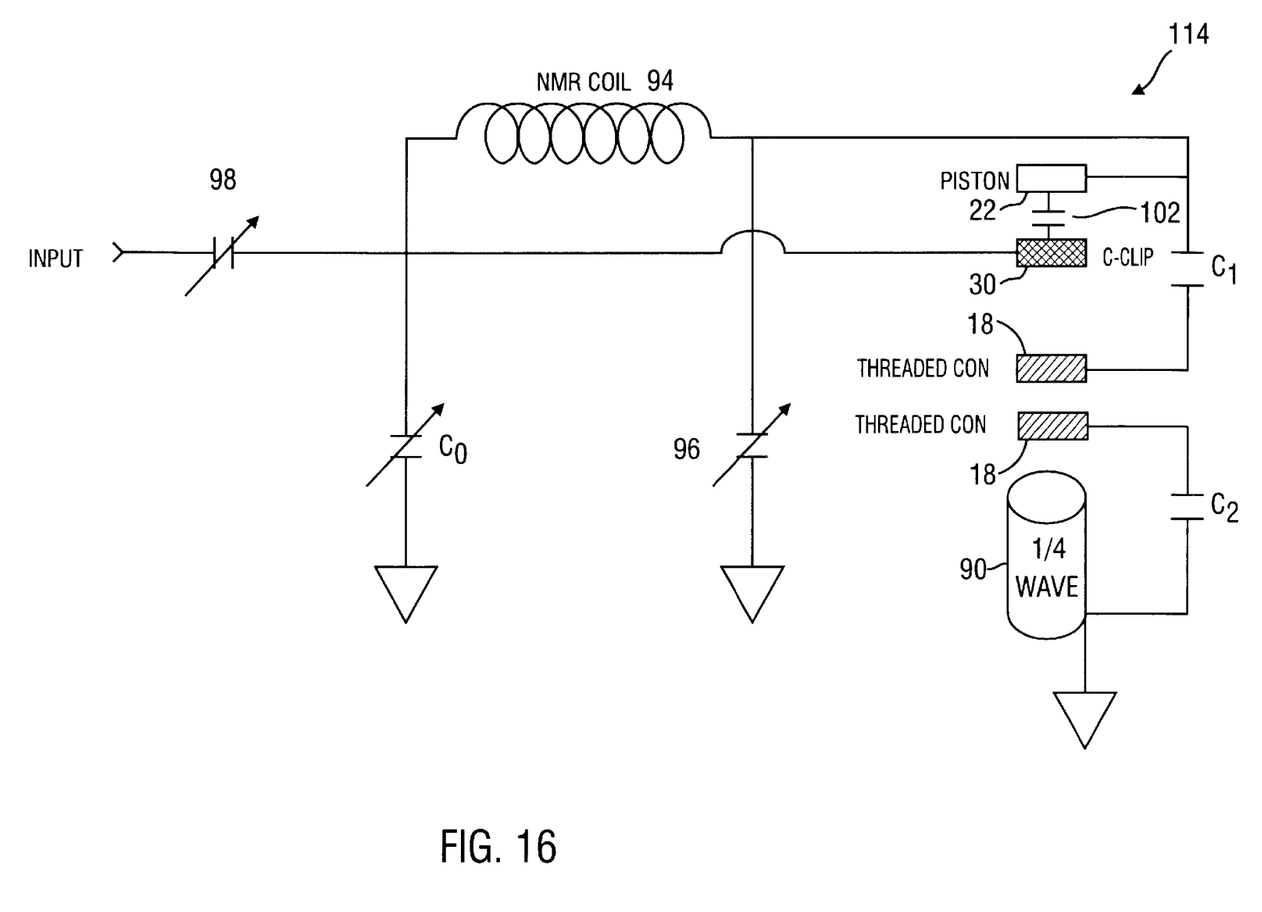
FIG. 16 is a schematic diagram illustrating the NMR circuit for single-tune operation incorporating the capacitor stick with the ¼ wave circuit switch of FIG. 14.

In the assembled illustration of FIG. 15, the Teflon spacer 20 advantageously separates and insulates the two active threaded contacts 18 from each other to achieve the desired single tune LC circuit 114 of FIG. 16. The spring clip 30 provides an electrical point of contact used in conjunction with the capacitor stick 100 to facilitate single tuning operations, and the stud 32 conveniently connects the spring clip 30 to the external chip capacitor 102 and locates it precisely relative to the switch housing 12. The electrically conducting capacitor stick standoff 106 provides a convenient area for the spring clip 30 to engage the capacitor stick 100 for electrical contact with the chip capacitor 102. The remainder of the capacitor stick 100 is desirably made of an electrically nonconducting material.

The piston 22 provides an electrical point of contact for the chip capacitor 102 on the capacitor stick 100, and is sized to move longitudinally inside the second cavity step 48 of the switch housing 12. When the capacitor stick 100 is inserted through the second opening 44 into the switch housing 12 and the threaded mount 110 is mounted to the lower threaded contact 18 shown to the right in FIG. 15, the chip capacitor 102 at the end comes in contact with the piston 22, which serves as a resiliently supported, movable electrical contact. As the piston 22 is pushed toward the plug 28, the pair of crescent washers 26 sandwiched between the plug 28 and the piston 22 exert a reactive spring force in the form of a compression on the capacitor stick 100 against the threaded mount 110. The Teflon plug 28 provides a definitive mechanical and insulating stop for the movable piston 22 to limit its travel. The compressive spring force of the crescent washers 26 efficiently and effectively prevents the capacitor stick 100 from becoming unthreaded from the lower threaded contact 18. When the capacitor stick 100 is removed, the crescent washers 26 decompress and push the piston 22 back to its original position bearing against the second distal constraint provided by the second cavity step 48 of the switch housing 12.

C. Double Tune Configuration

Figure 17:
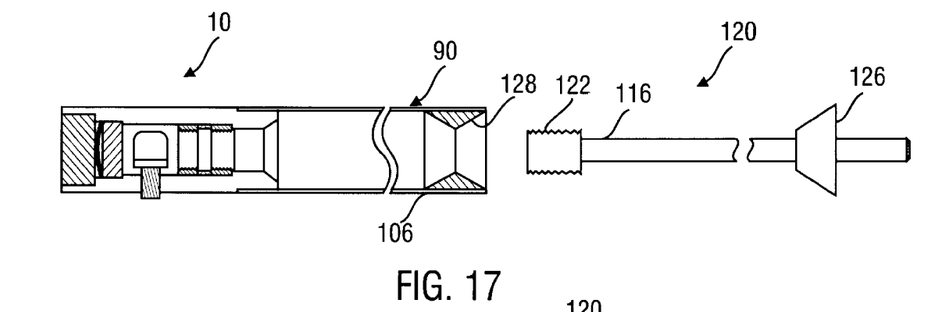
FIG. 17 is a partial cross-sectional view of the ¼ wave circuit switch of FIG. 1 connected to the ¼ wave tube of FIG. 12 adjacent a ¼ wave stick.
Figure 18:
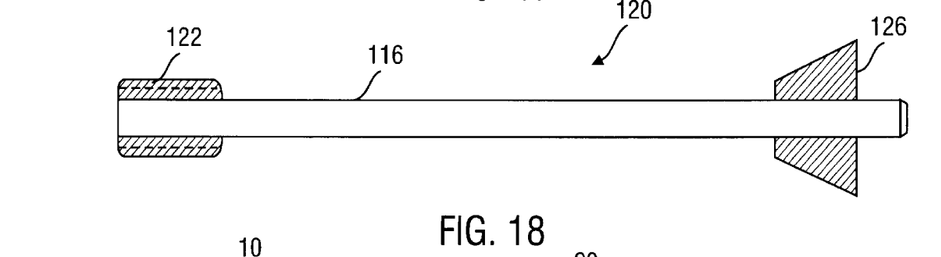
FIG. 18 is a partial cross-sectional view of the ¼ wave stick of FIG. 17.

The ¼ wave circuit switch 10 may advantageously be adapted to the ¼ wave tube 90 for use with a ¼ wave center conductor 116 schematically shown in FIG. 17 to produce a double-tune probe for the NMR circuit 92 of FIG. 11. As shown in FIGS. 17 and 18, the ¼ wave center conductor 116 is desirably supported by a ¼ wave wand or stick 120 having a threaded tip 122 at one end. A conical insert 126 is advantageously provided adjacent the other end of the ¼ wave stick 120 spaced from the threaded tip 122 by a distance approximately equal to the distance between the threaded contacts 18 inside the switch housing 12 to the tapered opening 128 of the ¼ wave tube 90. The conical insert 126 is desirably shaped to cooperate with the tapered opening 128 of the ¼ wave tube 90 and connect with the ¼ wave center conductor 116, for instance, by soldering. The entire ¼ wave stick 120 is desirably made of an electrically conducting material, more desirably of OFHC copper.

Figure 19:
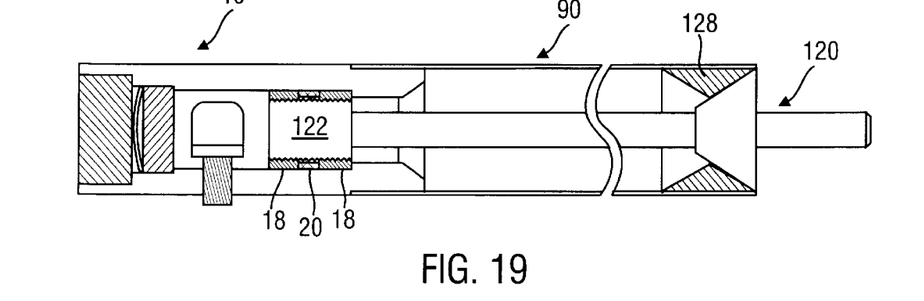
FIG. 19 is a partial cross-sectional view illustrating the assembly of the ¼ wave stick inserted through the ¼ wave tube into the ¼ wave circuit switch of FIG. 17.
Figure 20:
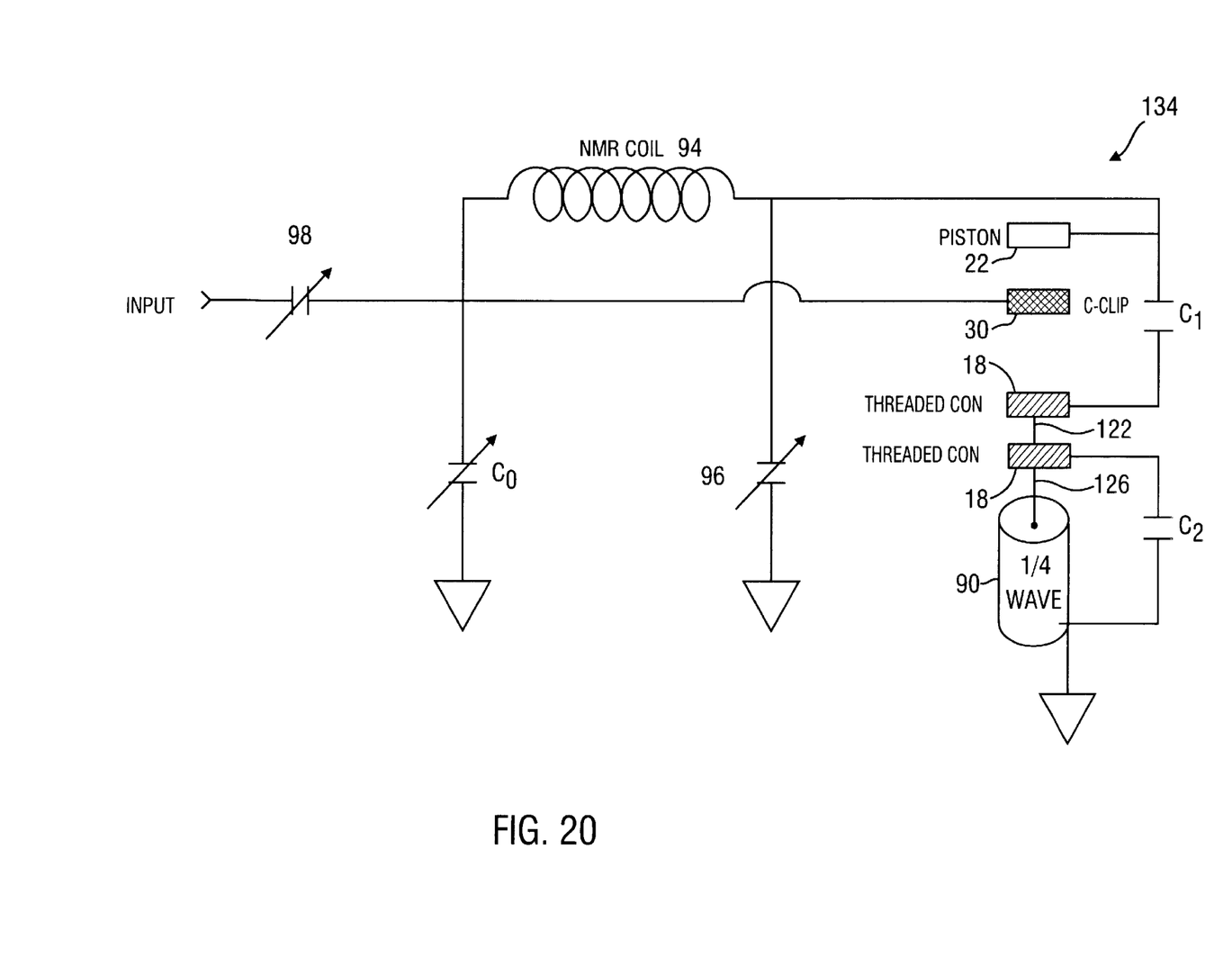
FIG. 20 is a schematic diagram illustrating the NMR circuit for double-tune operation incorporating the ¼ wave stick with the ¼ wave tube and ¼ wave circuit switch of FIG. 19.

Referring to the illustrated ¼ wave circuit assembly of FIG. 19, the threaded tip 122 of the ¼ wave stick 120 desirably is sufficiently long to engage both of the threaded contacts 18 that are spaced by the Teflon spacer 20 simultaneously. The threaded contacts 18 advantageously provide a fixed mechanical mounting point for the ¼ wave center conductor 116 and provide electrical points of contact when the ¼ wave center conductor 116 is installed. The conical insert 126 is desirably in electrical contact with the tapered opening 128 of the ¼ wave tube 90. This configuration utilizing the simultaneous contact of the threaded contacts 18 creates a current path which grounds the double tune NMR circuit 134 through the ¼ wave tube 90 via the conical insert 126 that electrically connects the ¼ wave tube 90 to the ¼ wave center conductor 116 as illustrated in FIG. 20. As a result, the double tune LC circuit 134 as completed by joining the pair of threaded contacts 18 may resonate at two separate frequencies. The ¼ wave tube 90 is advantageously tuned to resonate at the higher frequency (e.g., 121 MHz) and is seen by the higher frequency as a parallel resonator with an infinite impedance at that frequency. A low frequency (e.g., 75.4 MHz) desirably is sufficiently far apart from the high frequency and sees the ¼ wave tube 90 as a short to ground. Consequently, the high frequency current path is through the tune capacitors 96, 98, while the low frequency current path is through the ¼ wave tube 90.

Figure 21:
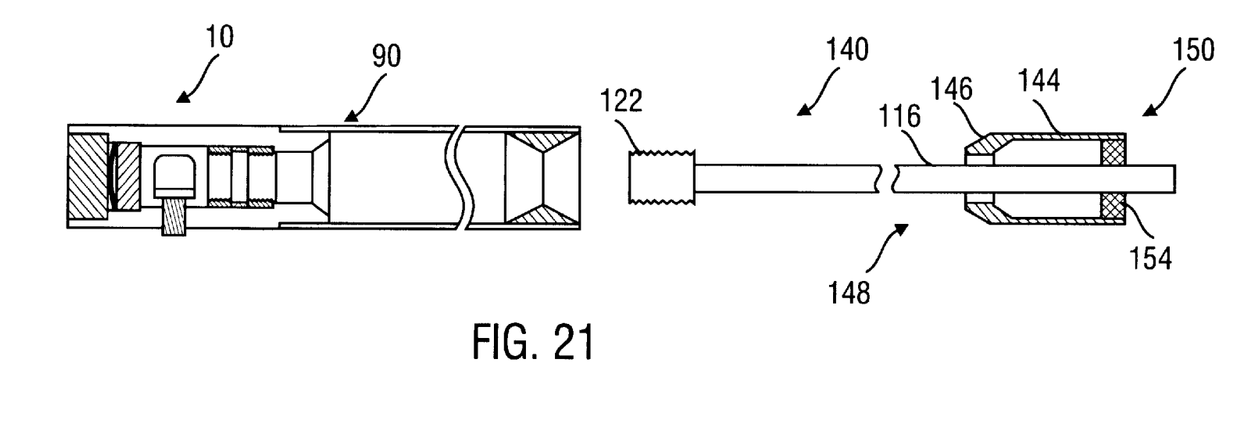
FIG. 21 is a partial cross-sectional view of the ¼ wave circuit switch of FIG. 1 connected to the ¼ wave tube of FIG. 12 adjacent a ¼ wave extension stick.
Figure 22:
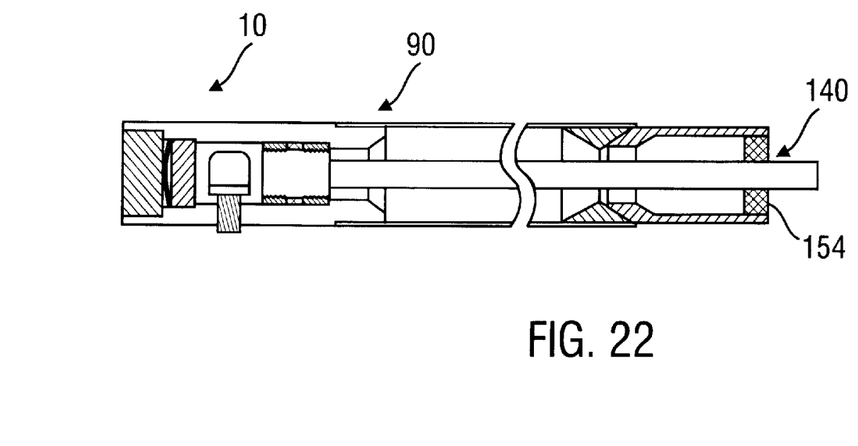
FIG. 22 is a partial cross-sectional view illustrating the assembly of the ¼ wave extension stick inserted through the ¼ wave tube into the ¼ wave circuit switch of FIG. 21.

Advantageously, the high and low resonant frequencies may be adjusted easily by effectively changing the length of the ¼ wave tube 90 without the need to replace the ¼ wave tube 90. This is accomplished by substituting a ¼ wave extension stick 140 as shown in FIG. 21 for the ¼ wave stick 120 of FIG. 18. The ¼ wave extension stick 140 differs from the ¼ wave stick 120 in that the conical insert 126 is replaced by an extension tube or housing 144. The extension tube 144 has a conical mating surface 146 at the proximal end 148 similar to that of the conical insert 126, but the conical mating surface 146 is no longer connected to the ¼ wave center conductor 116, but is spaced therefrom. In the assembled illustration of FIG. 22, the conical mating surface 146 is connected to the tapered opening 128 of the ¼ wave tube 90, for example, by soldering, and desirably by slip fit. The conical mating surface 146 desirably bears releasably against the tapered opening 128 when the ¼ wave extension stick 140 is installed. At the distal end 150 of the extension tube 144 is a shorting member or disc 154 that electrically connects the distal end 150 of the extension tube 144 to the ¼ wave center conductor 116, for instance, by releasable slip fit. The shorting disc 154 shorts the ¼ wave tube 90 through the extension tube 144 with the ¼ wave center conductor 116 when the threaded tip 122 of the ¼ wave extension stick 140 makes simultaneous contact with the pair of spaced threaded contacts 18, as shown in FIG. 22. Such a connection between the extension tube 144 and the ¼ wave tube 90 effectively changes the length of the ¼ wave tube 90 and thereby alters the high and low resonant frequencies of the double tune NMR circuit 134. As a result, it is possible to standardize the ¼ wave tube 90 that structurally forms part of the NMR probe body and tune the double tune NMR circuit 134 to a wide variety of resonant frequencies by inserting a variety of ¼ wave extension sticks 140 with different length extension tubes 144 without undue experimentation. The components that make up the ¼ wave extension stick 140 are made of electrically conducting materials, desirably OFHC copper.

The use of the combination of piston 22 and crescent washers 26 not only creates a firm and precise electrical contact point between the capacitor stick 100 and the piston 22 but also effectively prevents the capacitor stick 100 from becoming unthreaded. The use of the spring clip 30 and spaced threaded contacts 18 allows the ¼ wave circuit switch 10 to be adaptable to either the capacitor stick 100 of FIG. 15 for the single tune operation illustrated in FIG. 16, or the ¼ wave stick 120 of FIG. 19 or the ¼ wave extension stick 140 of FIG. 22 for the double tune operation illustrated in FIG. 20. The ¼ wave circuit switch 10 of the present invention is thus versatile and efficient, and facilitates easy installation of the capacitor stick 100 and ¼ wave stick 120 or ¼ wave extension stick 140 to produce a switchable NMR probe.

It will be understood that the above-described arrangements of apparatus and the methods therefrom are merely illustrative of applications of the principles of this invention and many other embodiments and modifications may be made without departing from the spirit and scope of the invention as defined in the claims.

What is claimed is:

1. A ¼ wave circuit switch for NMR spectrometry, said circuit switch comprising:

a housing having a wall with a proximal end defining a proximal direction and a distal end defining a distal direction, and a cavity defined by said wall and extending from said proximal end to said distal end, said cavity including a plurality of cavity steps with distal constraints;

an insert plug disposed in a first said cavity step adjacent said proximal end and bearing against a first said distal constraint;

a piston disposed in a second said cavity step distal of said first cavity step and bearing against a second said distal constraint, said piston slidable relative to said second distal constraint;

a pair of spring washers disposed between and in contact with said piston and said insert plug;

a pair of threaded contacts spaced by an insulator, said threaded contacts and insulator disposed in a third said cavity step distal of said second cavity step and bearing against a third said distal constraint, said threaded contacts spaced from said piston; and a spring clip disposed in said third cavity step and spaced between said piston and said threaded contacts.

2. The ¼ wave circuit switch of claim 1, wherein said housing comprises an aperture through said wall to said second cavity step and at least one aperture through said wall to said third cavity step.

3. The ¼ wave circuit switch of claim 2, wherein said housing comprises three apertures through said wall to said third cavity step, said three apertures including a first aperture adjacent one said threaded contact, a second aperture adjacent the other said threaded contact, and a third aperture adjacent said spring clip.

4. The ¼ wave circuit switch of claim 3, further including a mounting screw extending through said third aperture and supported by a stud connected to said wall, said mounting screw supporting said spring clip in said third cavity step.

5. The ¼ wave circuit switch of claim 1, wherein said cavity includes a fourth said cavity step distal of said third cavity step.

6. The ¼ wave circuit switch of claim 1, wherein said housing and insert plug are electrically nonconducting and said piston, said threaded contacts, said spring washers, and said spring clip are electrically conducting.

7. The ¼ wave circuit switch of claim 1, wherein said insert plug and spring washers form a resilient proximal constraint for constraining said piston in said proximal direction.

8. A ¼ wave circuit switch for use with a ¼ wave tube in single tune and double tune operations, comprising:

a housing having a wall defining a cavity;

a pair of electrically conducting threaded contacts insulated from each other and supported inside said cavity;

a resiliently supported, movable electrical contact disposed inside said cavity and spaced from said threaded contacts; and an electrically conducting spring clip extending from said wall of said housing into a space in said cavity between said threaded contacts and said movable electrical contact.

9. The ¼ wave circuit switch of claim 8, wherein said pair of electrically conducting threaded contacts are spaced by an insulating spacer.

10. The ¼ wave circuit switch of claim 8, wherein said threaded contacts are copper disks with generally circular, internally threaded surfaces.

11. The ¼ wave circuit switch of claim 8, wherein said movable electrical contact comprises a piston resiliently biased by at least one crescent washer toward said spring clip.

12. The ¼ wave circuit switch of claim 11, wherein said crescent washer is supported by an insert plug disposed at least partially inside said cavity, said crescent washer sandwiched between said insert plug and said piston.

13. The ¼ wave circuit switch of claim 12, wherein said insert plug is substantially rigidly mounted in said cavity.

14. An NMR circuit switch comprising:

a housing including a cavity extending from a proximal end to a distal end for detachably receiving a capacitor stick holding an external capacitor;

a first threaded member supported inside said cavity and mating with a threaded portion of said capacitor stick to form a threaded mount;

a first contact means disposed inside said cavity for electrically contacting a first end of said external capacitor and resiliently compressing said capacitor stick against said threaded mount to prevent unthreading between said first threaded member and said threaded portion; and a second contact means supported inside said cavity for electrically contacting a second end of said external capacitor.

15. The NMR circuit switch of claim 14, wherein said first contact means comprises a movable member supported between a step constraint provided in said cavity and a resilient constraint that resilient biases said movable member toward said step constraint.

16. The NMR circuit switch of claim 15, wherein said first contact means further comprises a stopper supporting said resilient constraint inside said cavity.

17. The NMR circuit switch of claim 16, wherein said stopper comprises a threaded insert substantially fixed with respect to said housing.

18. The NMR circuit switch of claim 15, wherein said resilient constraint comprises a pair of crescent washers.

19. The NMR circuit switch of claim 14, wherein said second contact means comprises a C-clip supported by said housing.

20. The NMR circuit switch of claim 14, wherein said second contact means is disposed between said first contact means and said first threaded member.

21. The NMR circuit switch of claim 14, further comprising a second threaded member spaced by an insulator from said first threaded member and supported in said cavity, said first and second threaded members for electrically contacting a ¼ wave center conductor received into said cavity.

22. A ¼ wave circuit assembly comprising:

a circuit switch having a cavity defined between a proximal end and a distal end said circuit switch including a pair of electrical contacts spaced by an insulating spacer and disposed in said cavity;

a ¼ wave tube having a proximal end connected to a said distal end of said housing; and a ¼ wave stick detachably extending through said ¼ wave tube and at least partially through said cavity, said ¼ wave stick comprising a ¼ wave center conductor having a tip near a proximal end for electrically contacting said pair of electrical contacts and a shorting member near a distal end for electrical communication of said ¼ wave center conductor with said ¼ wave tube.

23. The ¼ wave circuit assembly of claim 22, wherein said ¼ wave stick further comprises an extension tube having a proximal end releasably contacting electrically a distal end of said ¼ wave tube and a distal end electrically contacting said shorting member, which is releasably connected to said ¼ wave center conductor.

24. The ¼ wave circuit assembly of claim 23, wherein said extension tube and said ¼ wave tube are substantially the same in cross-section.

25. The ¼ wave circuit assembly of claim 22, wherein said shorting member is an annular disk having an inner edge substantially defined by said ¼ wave center conductor and an outer edge substantially defined by said ¼ wave tube.

26. The ¼ wave circuit assembly of claim 22, wherein said pair of electrical contacts are internally threaded and said tip of said ¼ wave center conductor is externally threaded.

27. The ¼ wave circuit assembly of claim 22, wherein said circuit switch further comprises a resiliently supported, movable electrical contact disposed inside said cavity and spaced from said pair of electrical contacts and an electrically conducting spring clip disposed in said cavity and spaced between said movable electrical contact and said pair of electrical contacts.

28. The ¼ wave circuit assembly of claim 27, wherein said movable electrical contact comprises a piston resiliently biased by at least one crescent washer toward said spring clip.

29. The ¼ wave circuit assembly of claim 28, wherein said crescent washer is supported by an insert plug disposed at least partially inside said cavity, said crescent washer sandwiched between said insert plug and said piston.

30. The ¼ wave circuit assembly of claim 27, wherein said movable electrical contact is spaced from said spring clip for contacting a first end of an external capacitor with said movable electrical contact and contacting a second end of said external capacitor with said spring clip, said external capacitor being supported by a capacitor stick and inserted into said cavity through said ¼ wave tube.

* * * * *